United States Patent
Chen et al.

(10) Patent No.: US 10,119,991 B2
(45) Date of Patent: Nov. 6, 2018

(54) VERTICAL PROBE DEVICE AND SUPPORTER USED IN THE SAME

(71) Applicant: MPI CORPORATION, Chu-Pei, Hshinchu Shien (TW)

(72) Inventors: Tsung-Yi Chen, Chu-Pei (TW); Horng-Kuang Fan, Chu-Pei (TW); Ching-Hung Yang, Chu-Pei (TW); Chung-Tse Lee, Chu-Pei (TW); Chia-Yuan Kuo, Chu-Pei (TW); Tien-Chia Li, Chu-Pei (TW); Ting-Ju Wu, Chu-Pei (TW); Shang-Jung Hsieh, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 477 days.

(21) Appl. No.: 14/668,374

(22) Filed: Mar. 25, 2015

(65) Prior Publication Data

US 2015/0276800 A1    Oct. 1, 2015

(30) Foreign Application Priority Data

Mar. 25, 2014 (TW) .............................. 103111115 A
Nov. 24, 2014 (TW) .............................. 103140682 A

(51) Int. Cl.
*G01R 31/00* (2006.01)
*G01R 31/02* (2006.01)
(Continued)

(52) U.S. Cl.
CPC ........... *G01R 1/0408* (2013.01); *G01R 1/067* (2013.01); *G01R 1/07357* (2013.01); *G01R 1/07371* (2013.01); *G01R 31/2891* (2013.01)

(58) Field of Classification Search
CPC .......... H01R 12/00; H01R 13/00; G01R 1/04; G01R 1/067; G01R 31/00; G01R 31/02; G01R 31/28
(Continued)

(56) References Cited

U.S. PATENT DOCUMENTS 4,027,935 A * 6/1977 Byrnes ............... G01R 1/07357
                                                            439/289
6,294,922 B1 * 9/2001 Okubo ..................... G01R 3/00
                                                            324/755.06
(Continued)

FOREIGN PATENT DOCUMENTS

| JP | 1999-038044 | 2/1999 |
| KR | 20090026815 | 3/2009 |

(Continued)

*Primary Examiner* — Neel Shah
(74) *Attorney, Agent, or Firm* — Muncy, Geissler, Olds & Lowe, P.C.

(57) ABSTRACT

A vertical probe device includes a lower die having engaging holes and needle holes, a positioning film having limiting holes and needle holes, probe needles inserted through the needle holes, and supporters having at least an upper stopping surface and at least a lower stopping surface for moveably limiting the positioning film therebetween. Each supporter has a head, a neck passing through the limiting hole and having a length longer than the thickness of the positioning film, a body, and a tail inserted into the engaging hole, which are connected in order, and at least one of the upper and lower stopping surfaces. The supporters can prevent the positioning film from being lifted and flipped over and enables the positioning film to move so that the probe needles are reliable.

3 Claims, 14 Drawing Sheets

(51) Int. Cl.
*G01R 31/28* (2006.01)
*G01R 1/04* (2006.01)
*G01R 1/067* (2006.01)
*H01R 12/00* (2006.01)
*H01R 13/00* (2006.01)
*G01R 1/073* (2006.01)

(58) Field of Classification Search
USPC ..... 324/750.25, 754, 758, 761, 765, 756.01, 324/756.03, 754.01, 754.03, 754.07; 439/65, 66, 79, 81, 91, 482, 591
See application file for complete search history.

(56) References Cited

U.S. PATENT DOCUMENTS

| | | | |
|---|---|---|---|
| 6,411,112 B1 * | 6/2002 | Das | G01R 1/07357 324/754.2 |
| 7,400,156 B2 | 7/2008 | Wu et al. | |
| 8,547,127 B2 * | 10/2013 | Lee | G01R 1/06716 324/755.01 |
| 2002/0155735 A1 * | 10/2002 | Zhou | G01R 1/06711 439/66 |
| 2008/0061803 A1 * | 3/2008 | Lane | G01R 27/205 324/715 |
| 2008/0186037 A1 * | 8/2008 | Ko | G01R 1/07342 324/754.07 |
| 2009/0002009 A1 * | 1/2009 | Brandorff | G01R 1/07357 324/750.16 |
| 2011/0128028 A1 | 6/2011 | Lin et al. | |

FOREIGN PATENT DOCUMENTS

| | | |
|---|---|---|
| KR | 20140003761 | 1/2014 |
| TW | I299085 | 7/2008 |
| TW | 201120452 | 6/2011 |

* cited by examiner

VERTICAL PROBE DEVICE AND SUPPORTER USED IN THE SAME

BACKGROUND OF THE INVENTION

1. Field of the Invention

The present invention relates generally to probe cards and more particularly, to a vertical probe device used in a probe card and a supporter used in the vertical probe device.

2. Description of the Related Art

Taiwan Patent No. 1299085, which corresponds to U.S. Pat. No. 7,400,156, disclosed a vertical probe device which comprises a probe seat composed of upper and lower dies or upper, middle and lower dies, a positioning film disposed between the upper and lower dies, and a plurality of probe needles. Each probe needle has a head penetrating through the upper die and the positioning film, a tail penetrating through the lower die, and a curved body located in an accommodating space defined between the upper and lower dies. When contacting contacts of devices under test (hereinafter referred to "DUTs") with different heights, the tails of the probe needles are movable vertically to adjust heights of needle-points thereof to the heights of the contacts, respectively. The positioning film is adapted for positioning the heads of the probe needles before the upper die is installed, so that the probe needles will not oblique and therefore the upper die will be installed positively and smoothly.

In a conventional arrangement, the positioning film is suspended in the above-mentioned accommodating space. However, in this way, if the upper die needs to be removed temporarily for replacement of the probe needles, the positioning film is liable to be lifted and flipped over while the upper die is removed. Meanwhile, the probe needles might be pulled up along with the positioning film that is flipped over. In this case, reinstalling the pulled-up probe needles is time-consuming; besides, the probe needles might be damaged when being pulled up.

In another conventional arrangement, the positioning film is fastened on a top surface of the lower die, such that the positioning film is prevented from being the probe needles receive external force, resulting in that the probe needles may bear lifted and flipped over. However, in this way, the positioning film is unmovable when relatively greater stress and thereby being easily damaged.

In the vertical probe device disclosed in the aforesaid Taiwan Patent No. I299085, the positioning film is placed on the lower die and movable in a small distance between the upper and lower dies. Besides, the positioning film can be fastened on the lower die by bolts, if necessary. Therefore, while the upper die is removed, the positioning film can be fastened on the lower die and thereby prevented from being lifted and flipped over. In another aspect, the top surface of the upper die of the probe device will be connected with a circuit board or a space transformer, and the circuit board or the space transformer might be provided at a bottom surface thereof with electronic components, such that the electronic components will occupy some space around the top of the probe device. In other words, the probe device might need to be provided at the top thereof with some reserved areas for accommodating electronic components. However, the reserved areas usually overlap the areas for fastening the positioning film to the lower die. Therefore, the vertical probe device disclosed in the aforesaid patent is not applicable in the situation that the top thereof should accommodate electronic components.

In addition, Taiwan Patent Publication No. 201120452, which corresponds to US Publication No. 2011/0128028, disclosed a maintenance device which is adapted to be installed in a probe device for fastening the positioning film of the probe device, thereby preventing the positioning film from being lifted and flipped over. However, although the maintenance device has the effect of fastening the positioning film, it is composed of so many elements as to be complicated in construction and time-consuming in installation.

SUMMARY OF THE INVENTION

The present invention has been accomplished in view of the above-noted circumstances. It is an objective of the present invention to provide a vertical probe device and a supporter used in the vertical probe device, wherein the supporter can prevent a positioning film of the vertical probe device from being lifted and flipped over and enables the positioning film to move in a small distance so that probe needles of the vertical probe device are relatively reliable, and the vertical probe device is simple in construction, easily assembled and applicable in the situation that the top thereof should accommodate electronic components.

To attain the above objective, the present invention provides a vertical probe device which comprises a lower die having a plurality of engaging holes and a plurality of needle holes, a positioning film having a plurality of limiting holes and a plurality of needle holes, a plurality of probe needles inserted through the needle holes of the lower die and the needle holes of the positioning film respectively, and a plurality of supporters. Each supporter has a head, a neck, a body and a tail, which are connected in order. Each supporter further has at least one of an upper stopping surface provided at the head and a lower stopping surface provided at the body. At least one of the supporters has said upper stopping surface and at least one of the supporters has said lower stopping surface. The necks of the supporters pass through the limiting holes of the positioning film, respectively. The neck of each supporter is longer than the thickness of the positioning film, such that the positioning film is movably limited between at least one of the upper stopping surfaces and at least one of the lower stopping surfaces of the supporters. The tails of the supporters are inserted into the engaging holes of the lower die, respectively.

By the supporters, the positioning film is connected with the lower die firmly and thereby prevented from being lifted and flipped over along with an upper die, which is fastened on the lower die and penetrated through by the probe needles, while the user is removing the upper die. Although the position of the positioning film is limited by the supporters, the positioning film is still movable in a small distance between the upper and lower stopping surfaces of the supporters and therefore capable of preventing the probe needles from being overstressed to result in damage when the probe needles contact DUTs. Besides, the vertical probe device is simple in construction and easily assembled, and the supporters occupy so little space as to spare the space around the probe needles for accommodating electronic components.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
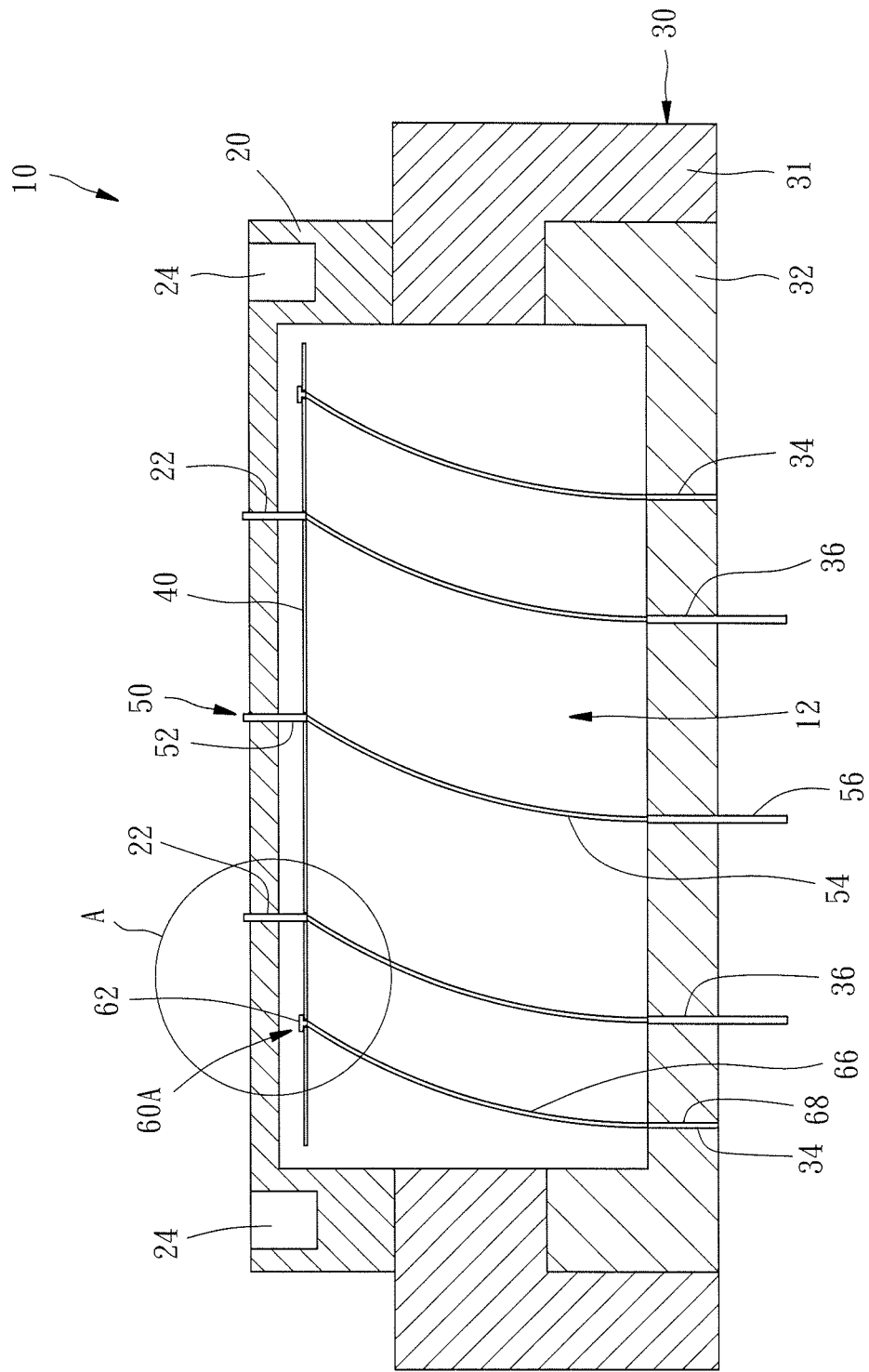
FIG. 1 is a schematic sectional view of a vertical probe device according to a first preferred embodiment of the present invention.

First of all, it is to be mentioned that same reference numerals used in the following preferred embodiments and the appendix drawings designate same or similar elements throughout the specification for the purpose of concise illustration of the present invention.

Figure 2:
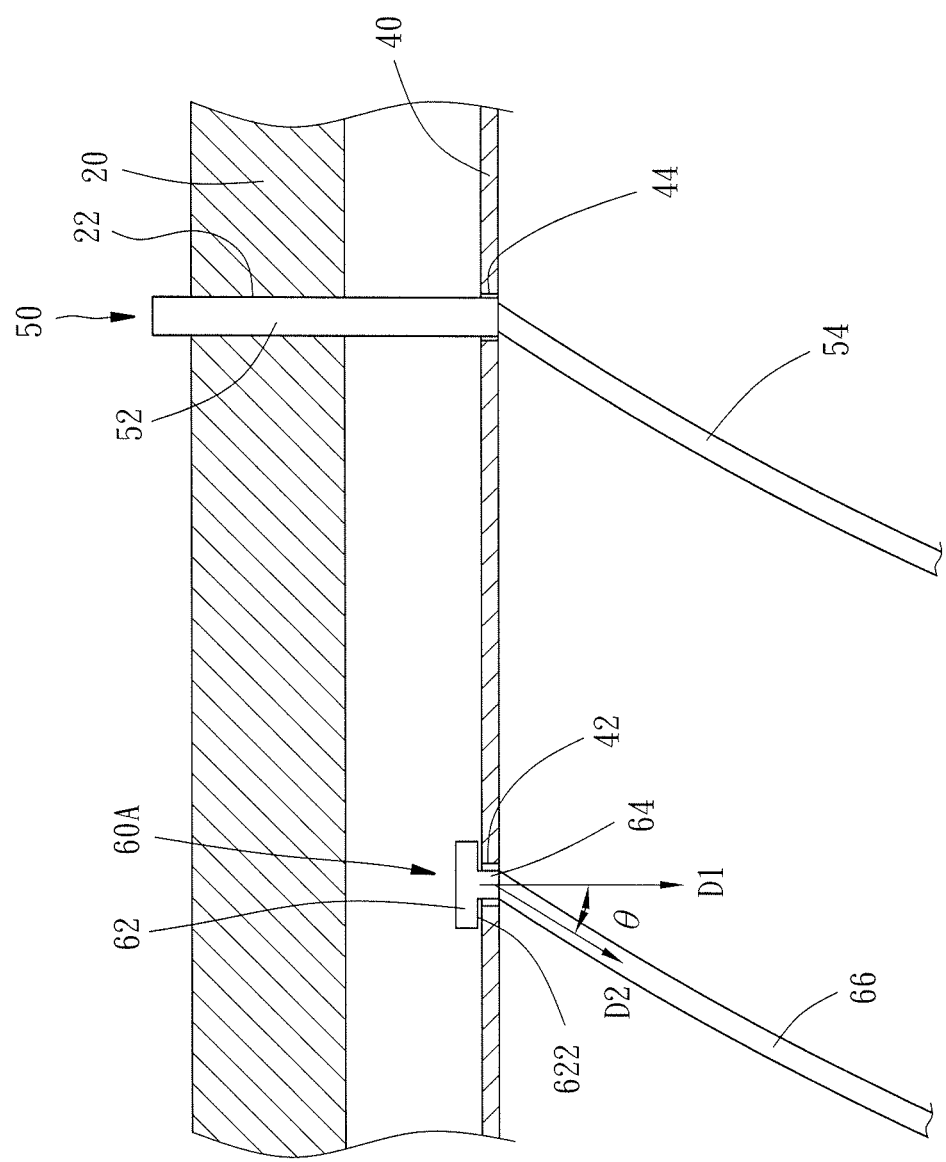
FIG. 2 is an enlarged view of the part A in FIG. 1.
Figure 3:
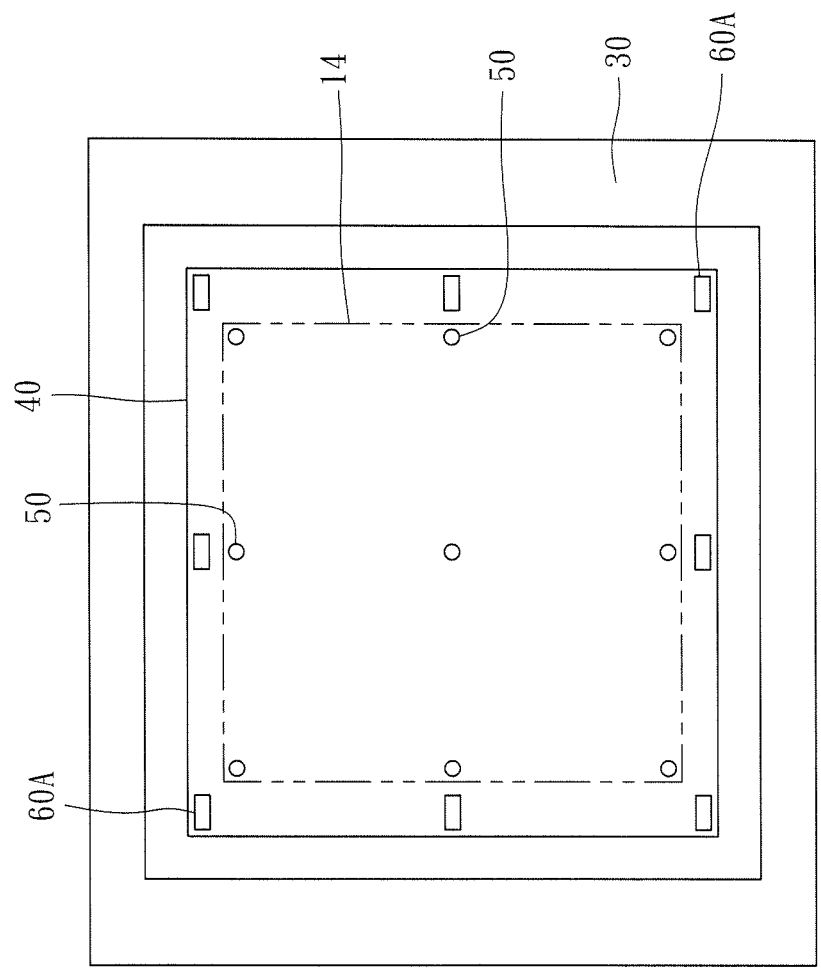
FIG. 3 is a schematic top view of the vertical probe device according to the first preferred embodiment of the present invention, wherein an upper die of the vertical probe device is removed for the convenience of illustration.

Referring to FIGS. 1-3, a vertical probe device 10 according to a first preferred embodiment of the present invention comprises an upper die 20, a lower die 30, a positioning film 40, a plurality of probe needles 50, and a plurality of supporters 60A.

The upper die 20 is fastened on the lower die 30 by bolts which are not shown in the figures, and an accommodating space 12 is formed between the upper die 20 and the lower die 30. In this embodiment, the lower die 30 belongs to a two-piece construction and comprises an upper element 31 and a lower element 32, which are fastened to each other by bolts (not shown). However, the lower die 30 may be a one-piece construction, which means the upper and lower elements 31, 32 may be made integrally. The upper die 20 has a plurality of needle holes 22. The lower die 30 has a plurality of engaging holes 34 and a plurality of needle holes 36.

Figure 4:
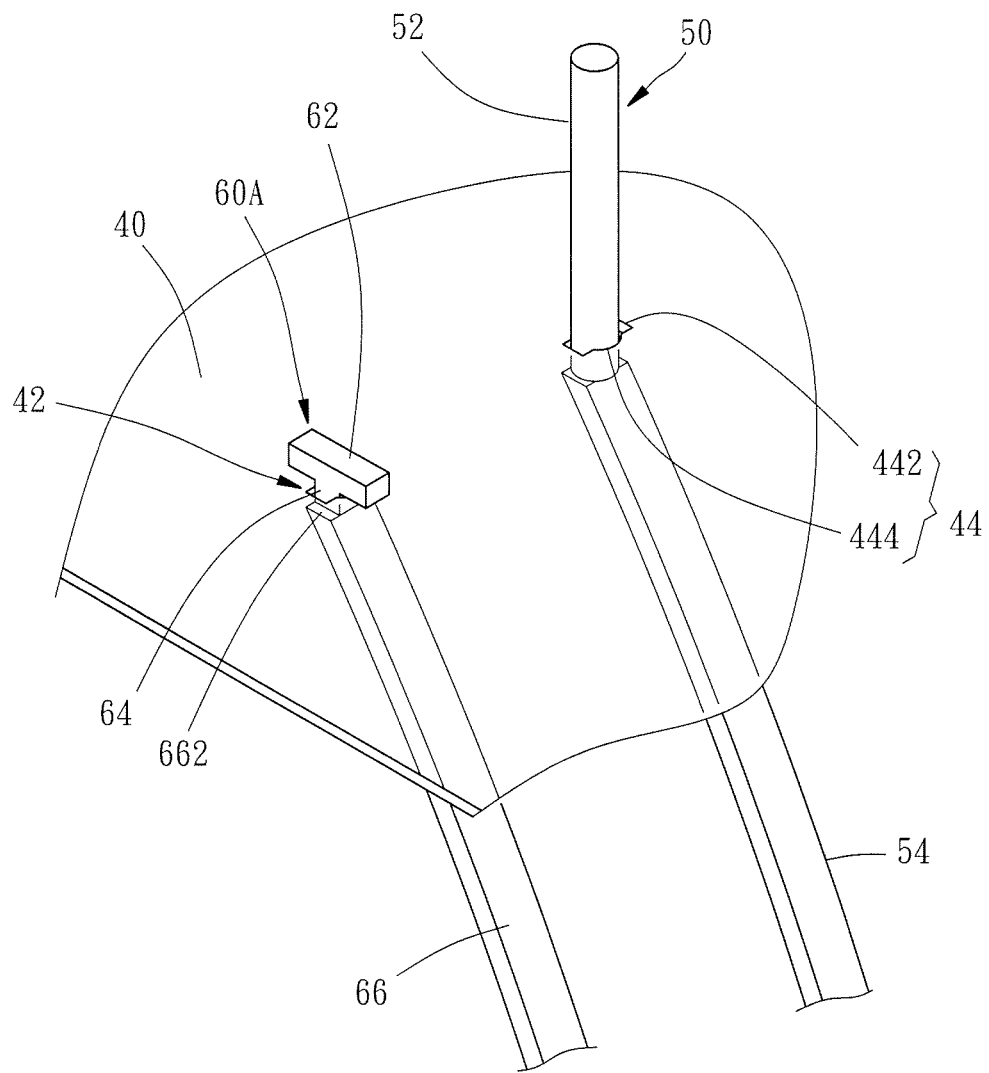
FIGS. 4-5 are schematic perspective views showing a positioning film, a probe needle and a supporter of the vertical probe device according to the first preferred embodiment of the present invention, illustrating the way of installing the probe needle and the supporter.
Figure 5:
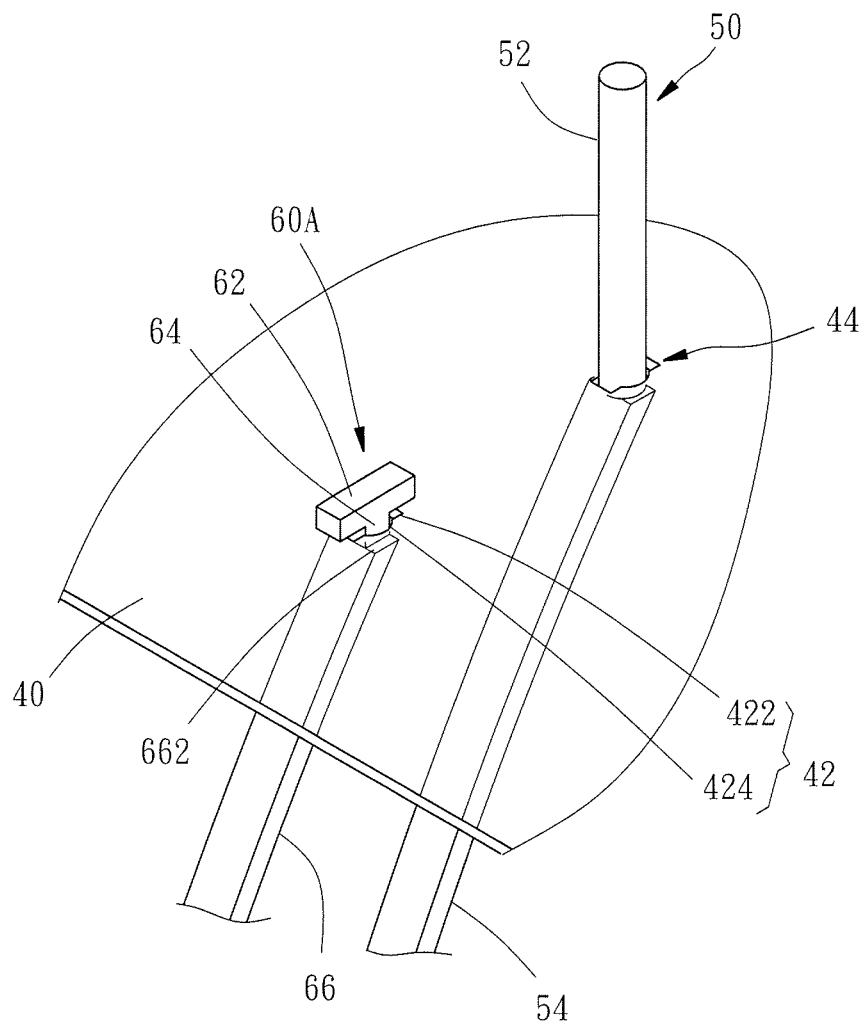
Figure 6:
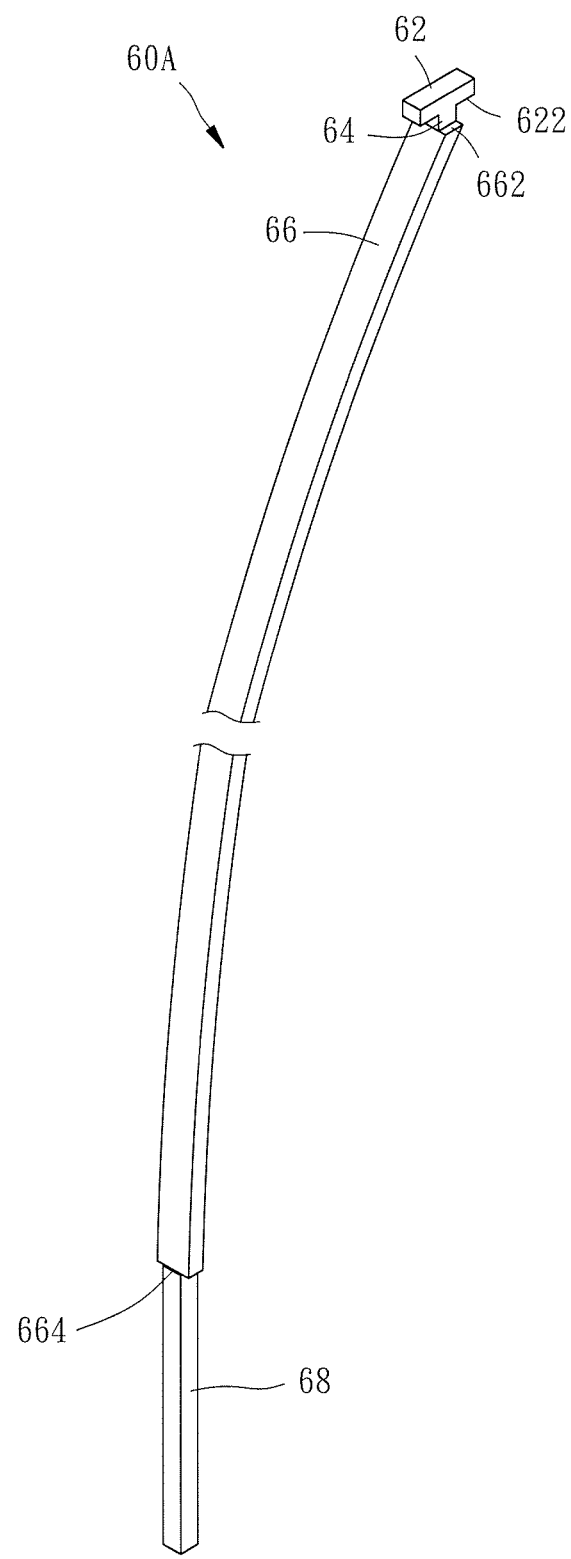
FIG. 6 is a schematic perspective view of the supporter according to the first preferred embodiment of the present invention.

The positioning film 40 is a flexible and insulated film having a plurality of limiting holes 42 and a plurality of needle holes 44. As shown in FIGS. 4-5, the limiting holes 42 and the needle holes 44 have a same profile and each of them has an elongated part 422 or 442 shaped as a narrow rectangle, and a circular expanded part 424 or 444 located in the middle of the elongated part 422 or 442.

Each probe needle 50 is a conventional vertical probe needle having a head 52, a body 54 and a tail 56, which are integrally connected in order. The head 52 and the tail 56 are shaped as straight cylinders and parallel to each other. The body 54 is curved in a way that the head 52 and the tail 56 located at two ends of the body 54 are not aligned with each other. The transverse cross-sections of the body 54 are shaped as narrow rectangles or ellipses.

Referring to FIGS. 2-6, each supporter 60A has a head 62, a neck 64, a body 66 and a tail 68, which are integrally connected in order. The head 62 is shaped as a cuboid having narrow-rectangle-shaped cross-sections perpendicular to a longitudinal direction D1. The head 62 has a bottom surface substantially perpendicular to the longitudinal direction D1, and the bottom surface is defined as an upper stopping surface 622. The neck 64 extends from the upper stopping surface 622 toward the longitudinal direction D1 and has square cross-sections perpendicular to the longitudinal direction D1 and having a side length approximately equal to the short side length of the upper stopping surface 622. The body 66 is curved and extends from the neck 64 toward an oblique direction D2. An included angel θ smaller than 90 degrees is formed between the oblique direction D2 and the longitudinal direction D1.

The body 66 has narrow-rectangle-shaped cross-sections perpendicular to the longitudinal direction D1 and having short sides approximately as long as the short sides of the upper stopping surface 622 and long sides shorter than the long sides of the upper stopping surface 622. Further, the long sides of the cross-sections of the body 66 extend in a direction perpendicular to the direction that the long sides of the upper stopping surface 622 extend along. In addition, the body 66 has a top surface and a bottom surface 664 both substantially perpendicular to the longitudinal direction D1, and the top surface is defined as a lower stopping surface 662. The tail 68 extends from the bottom surface 664 toward a direction substantially parallel to the longitudinal direction D1 and has cross-sections perpendicular to the longitudinal direction D1 and smaller than the bottom surface 664.

The positioning film 40, the probe needles 50 and the supporters 60A are installed on the lower die 30 before the upper die 20 is installed on the lower die 30. The heads 52 of the probe needles 50 are inserted through the needle holes 44 of the positioning film 40, respectively. The tails 56 of the probe needles 50 are inserted into the needle holes 36 of the lower die 30, respectively. The necks 64 of the supporters 60A are inserted through the limiting holes 42 of the positioning film 40, respectively. The tails 68 of the supporters 60A are inserted into the engaging holes 34 of the lower die 30, respectively.

Specifically speaking, the needle holes 44 and the limiting holes 42 of the positioning film 40 are configured having a size allowing the bodies 54, 66 of the probe needles 50 and the supporters 60A to just pass therethrough. After the tails 56, 68 and the bodies 54, 66 of the probe needles 50 and the supporters 60A pass respectively through the needle holes 44 and the limiting holes 42 of the positioning film 40 in order, the heads 52 of the probe needles 50 and the necks 64 of the supporters 60A may pass through and stay at locations corresponding to the expanded parts 444, 424 of the needle holes 44 and the limiting holes 42, as shown in FIG. 4. The necks 64 of the supporters 60A and the heads 52 of the probe needles 50 are rotatable in the expanded parts 424, 444 of the limiting holes 42 and needle holes 44 so that the probe needles 50 and the supporters 60A can be rotated at about 90 degrees from the posture shown in FIG. 4 to the posture shown in FIG. 5. When posed as shown in FIG. 5, the probe needles 50 and the supporters 60A are inseparable from the positioning film 40 when they are pushed upwards. Besides, the neck 64 of each supporter 60A has a length that is longer than the thickness of the positioning film 40, and the upper and lower stopping surfaces 622, 662 of the same supporter 60A substantially face to each other through the positioning film 40 placed therebetween; therefore, the positioning film 40 is movable and limited between the upper and lower stopping surfaces 622, 662 of the supporters 60A.

When the upper die 20 is installed on the lower die 30, the heads 52 of the probe needles 50 are further inserted through the needle holes 22 of the upper die 20. In this way, the head 52 of each probe needle 50 has a part protruding out of the upper die 20 for being electrically connected with a contact of a circuit board or a space transformer (not shown) when the vertical probe device 10 is mounted to the bottom of the circuit board or space transformer to form a probe card. In addition, the tail 56 of each probe needle 50 has a part protruding out of the lower die 30 for probing a contact of a DUT.

When the probe needles 50 of the vertical probe device 10 need to be replaced, the upper die 20 can be removed from the lower die 30. By the supporters 60A, the positioning film 40 is connected with the lower die 30 so firmly as to be prevented from being lifted and flipped over along with the upper die 20 while the upper die 20 is removed. Meanwhile, the probe needles 50 are prevented from being pulled up by accident.

Except for preventing the positioning film 40 from being lifted and flipped over, the supporters 60A also enable the positioning film 40 to move in a small distance between the upper and lower stopping surfaces 622, 662 of the supporters 60A and thereby prevent the probe needles 50 from being overstressed when the probe needles 50 contact the DUTs, such that the probe needles 50 may be more reliable. Besides, the vertical probe device 10 is simple in construction and easily assembled. The supporters 60A can be installed in the same process and similar way of installing the probe needles 50. In addition, the supporters 60A can be located very close to the probe needles 50 and occupy little space, and the positioning film 40 is suspended in the accommodating space 12 by the supporters 60A without the need of extending to the juncture of the upper and lower dies 20, 30. Therefore, if the circuit board or space transformer mounted on the top of the vertical probe device 10 is provided with an electronic component protruding out of the bottom surface of the circuit board or space transformer, the upper die 20 can be provided with an accommodating hole 24 as shown in FIG. 1 for accommodating the electronic component. The accommodating hole 24 shown in FIG. 1 is realized by a recess; however, the accommodating hole 24 may be a through hole. In other words, the supporter of the present invention can spare the space around the probe needles 50, which might be used to accommodate electronic components, so that the vertical probe device of the present invention is applicable in the situation that the top thereof should accommodate electronic components.

Figure 7:
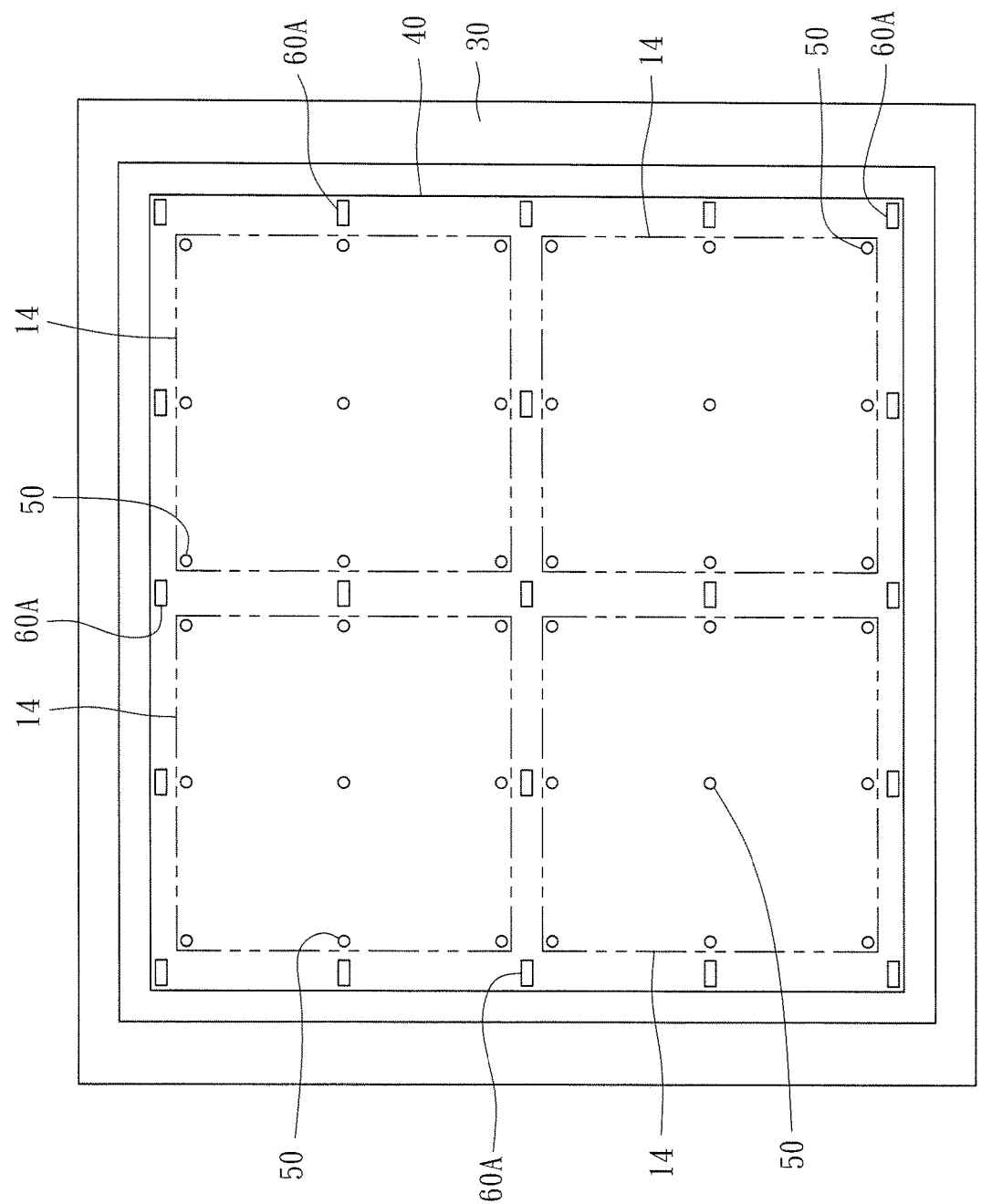
FIGS. 7-8 are similar to FIG. 3, but showing two other embodiments of the present invention, wherein the vertical probe device has a plurality of probe needle areas.
Figure 8:
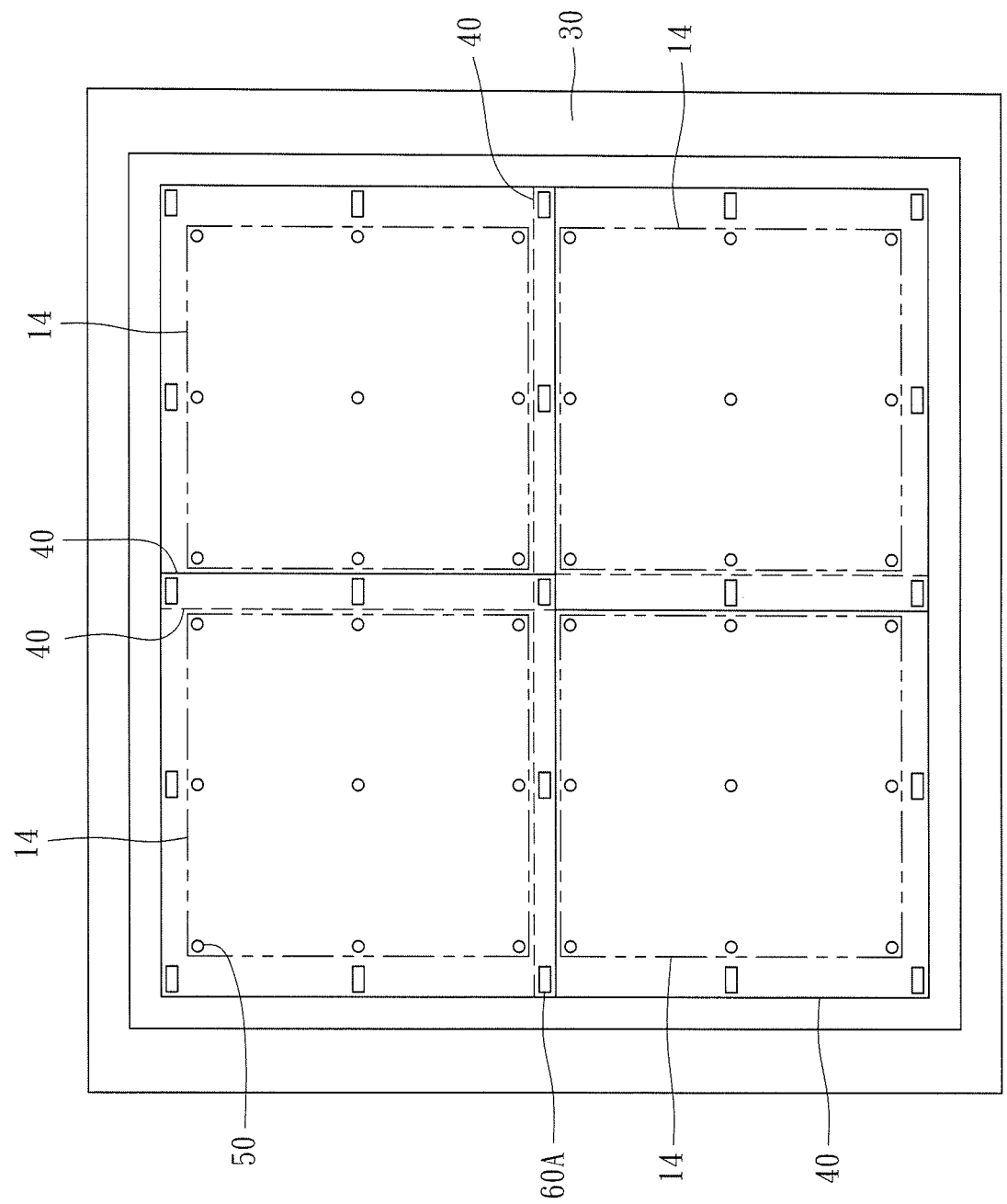

It will be appreciated that the vertical probe device 10 has a probe needle area 14 defined by the probe needles 50, as shown in FIG. 3. The supporters 60A are located at a periphery surrounding the probe needle area 14. By this arrangement, the supporters 60A can positively and efficiently support the positioning film 40. The vertical probe device of the present invention may be configured having a plurality of probe needle areas 14 for application in a multi-DUT probe card which is capable of probing a plurality of DUTs at the same time. For example, the vertical probe device shown in FIGS. 7-8 has four probe needle areas 14 for probing four DUTs at the same time. In the vertical probe device shown in FIG. 7, a positioning film 40 is shared by the probe needle areas 14, and the supporters 60A located between two adjacent probe needle areas 14 are located at a common periphery of said two adjacent probe needle areas 14. In this way, only a row of supporters 60A may be disposed between every two adjacent probe needle areas 14, such that the amount of the supporters 60A used in the vertical probe device is relatively fewer and the space occupied by the supporters 60A is relatively lesser. In the vertical probe device shown in FIG. 8, four positioning films 40 are used and covered over the four probe needle areas 14 respectively, and every two adjacent positioning films 40 are overlapped partially. In this case, some of the supporters 60A are located at overlapped peripheries of two adjacent probe needle areas 14, such that the positioning film 40 can be positively supported with relatively fewer supporters 60A; in other words, the supporter 60A located at the overlapped peripheries of two adjacent probe needle areas 14 has its neck 64 penetrating through the two overlapped positioning films 40.

Figure 9:
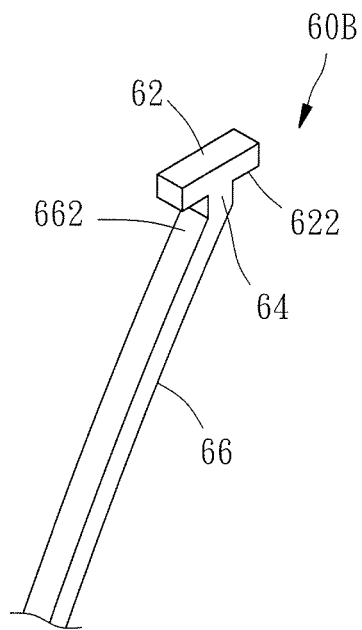
FIGS. 9-12 are schematic perspective views of supporters according to second to fifth preferred embodiments of the present invention.

The aforesaid vertical probe device 10 may use a supporter 60B configured according to a second preferred embodiment of the present invention, as shown in FIG. 9. The supporter 60B differs from the aforesaid supporter 60A in that the body 66 of the supporter 60B has cross-sections perpendicular to the longitudinal direction D1 and shaped approximately same with the cross-sections of the neck 64 so that the body 66 of the supporter 60B has no such top surface capable of stopping the positioning film 40. In alternate, the lower stopping surface 662 of the supporter 60B is formed by a side surface of the body 66 that extends from the neck 64 toward the oblique direction D2. Although the lower stopping surface 662 is not parallel to the upper stopping surface 622, but still substantially faces to the upper stopping surface 622 and is capable of limiting the positioning film 40 between the upper and lower stopping surfaces 622, 662.

It will be appreciated that the longitudinal direction D1 and the oblique direction D2 in the aforesaid second preferred embodiment and the following embodiments have the same definition with those described in the aforesaid first preferred embodiment and shown in FIG. 2. That is, the longitudinal direction D1 and the oblique direction D2 in all the embodiments are defined in the same way that the direction that the neck 64 extends from the head 62 is defined as the longitudinal direction D1 and the oblique direction D2 and the longitudinal direction D1 have an included angle θ smaller than 90 degrees therebetween.

Figure 10:
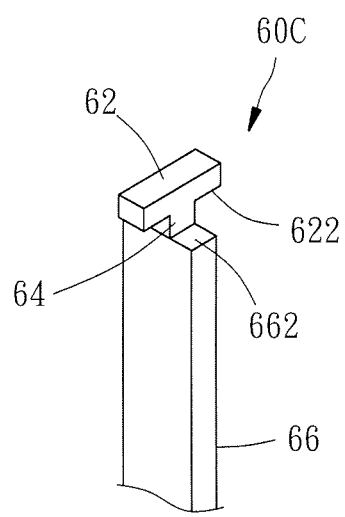

The aforesaid vertical probe device 10 may use a supporter 60C configured according to a third preferred embodiment of the present invention, as shown in FIG. 10. The supporter 60C differs from the aforesaid supporter 60A in that the body 66 of the supporter 60C extends from the neck 64 along the longitudinal direction D1, which means the body 66 of the supporter 60C is not curved.

Figures 11, 12:
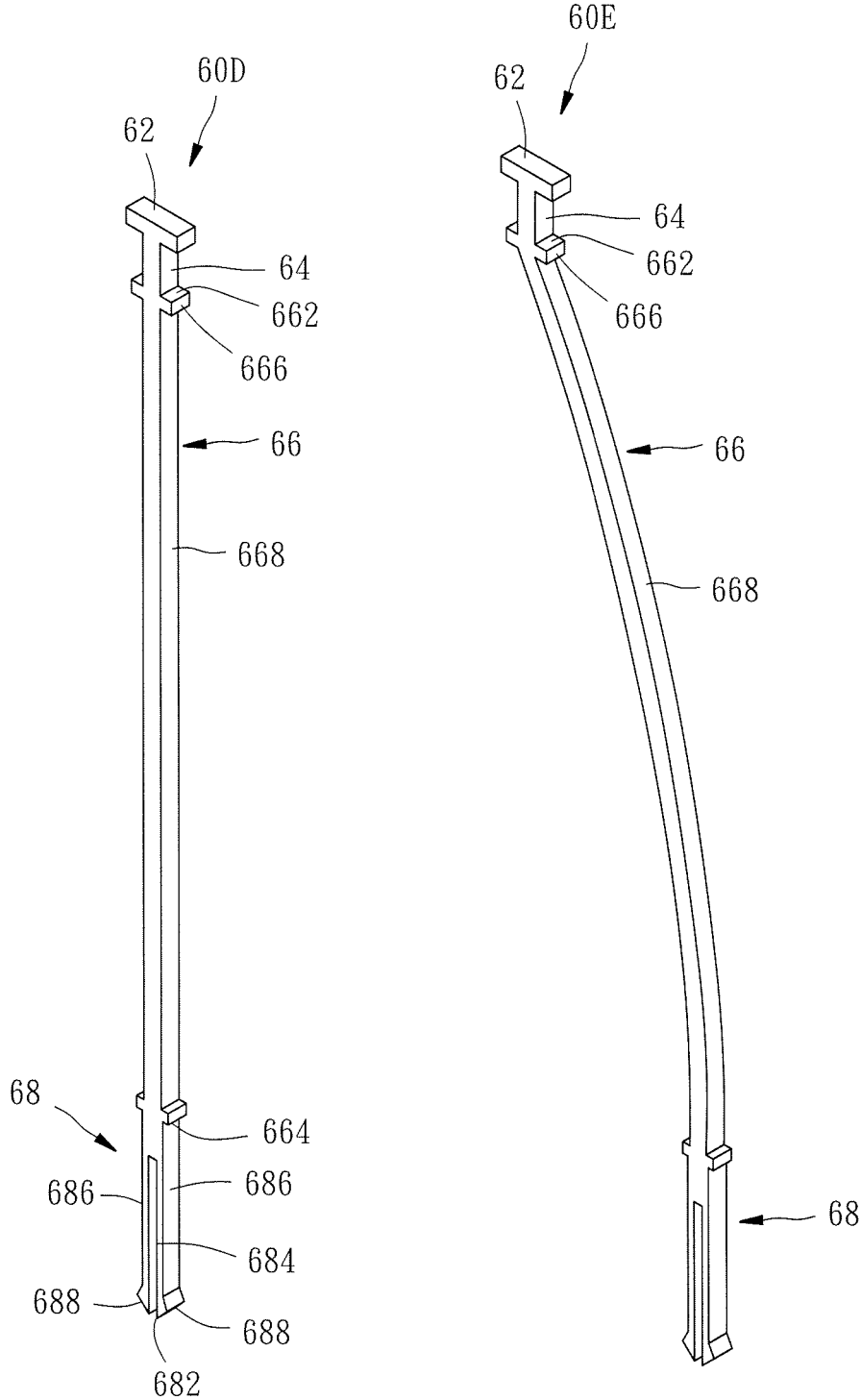

The aforesaid vertical probe device 10 may use a supporter 60D configured according to a fourth preferred embodiment of the present invention, as shown in FIG. 11. The supporter 60D differs from the aforesaid supporter 60C in the shape of the body 66. In the body 66 of the supporter 60C, the cross-sections perpendicular to the longitudinal direction D1 are shaped substantially same with the lower stopping surface 662. However, the body 66 of the supporter 60D has a stopping section 666 and an extending section 668; the lower stopping surface 662 is located at the stopping section 666, and the extending section 668 has cross-sections perpendicular to the longitudinal direction D1 and substantially smaller than the lower stopping surface 662.

The aforesaid vertical probe device 10 may use a supporter 60E configured according to a fifth preferred embodiment of the present invention, as shown in FIG. 12. The body 66 of the supporter 60E is similar to the body 66 of the aforesaid supporter 60D and has a stopping section 666 with larger transverse cross-sections and an extending section 668 with smaller transverse cross-sections. However, the extending section 668 of the supporter 60E extends curvedly from the stopping section 666 toward the oblique direction D2.

The tail 68 of each aforesaid supporter may be configured as the tail 68 shown in FIGS. 11-12, which has an end 682, a groove 684 opened at the end 682, and two engaging branches 686 separated by the groove 684 and capable of swinging elastically. In this way, when receiving an external force which pushes the engaging branches 686 to approach each other, the tail 68 can be squeezed into the engaging hole 34 of the lower die 30 to be engaged firmly in the engaging hole 34 and to prevent the supporter from rotating. Besides, the tail 68 may further have two barbs 688 located at the ends of the engaging branches 686 respectively for limiting the lower die 30 between the bottom surface 664 of the body 66 and the barbs 68; in this way, the tail 68 of the supporter is less possible to be separated from the lower die 30.

Figure 13:
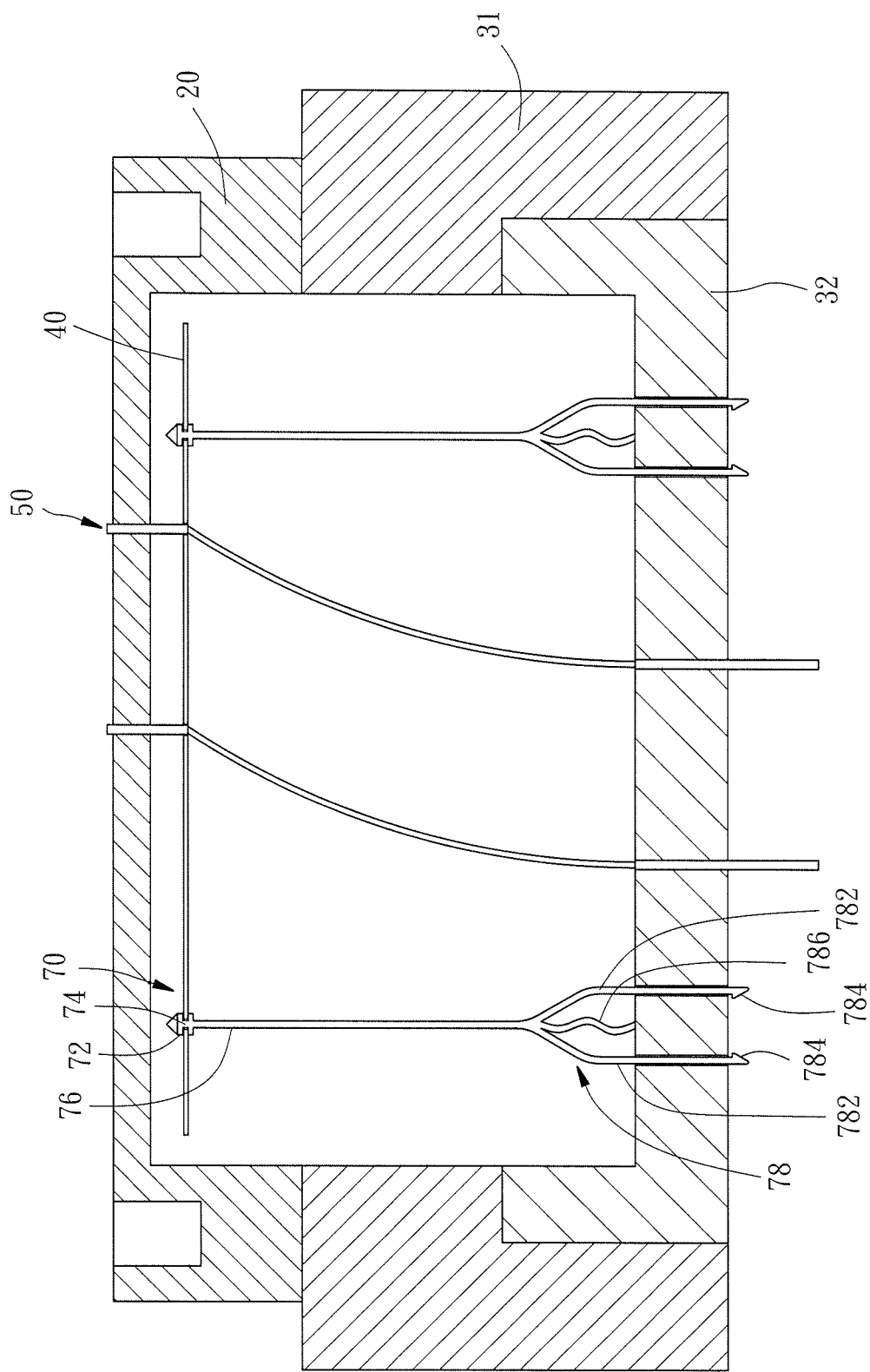
FIG. 13 is a schematic sectional view of a vertical probe device according to a sixth preferred embodiment of the present invention.

Referring to FIG. 13, another kind of supporter 70 is used in a vertical probe device according to a sixth preferred embodiment of the present invention. The supporter 70 has a head 72, a neck 74, a body 76 and a tail 78, which are integrally connected in order. The head 72 is elastically compressible to pass through the limiting hole 42 of the positioning film 40, such that the neck 74 can pass through the limiting hole 42 and limit the positioning film 40 between the head 72 and the body 76. The tail 78 of the supporter 70 has two supporting branches 782, two barbs 784 located at the ends of the supporting branches 782 respectively, and an elastic section 786 located between the supporting branches 782. The barbs 784 are elastically compressible, such that the bards 784 can be inserted through two engaging holes 34 of the lower die 30 respectively upon being compressed, such that the lower die 30 can be abutted between the elastic section 786 and the barbs 784. In this way, the supporter 70 can achieve the same effect with the supporter 60A described in the aforesaid first preferred embodiment.

Figure 14:
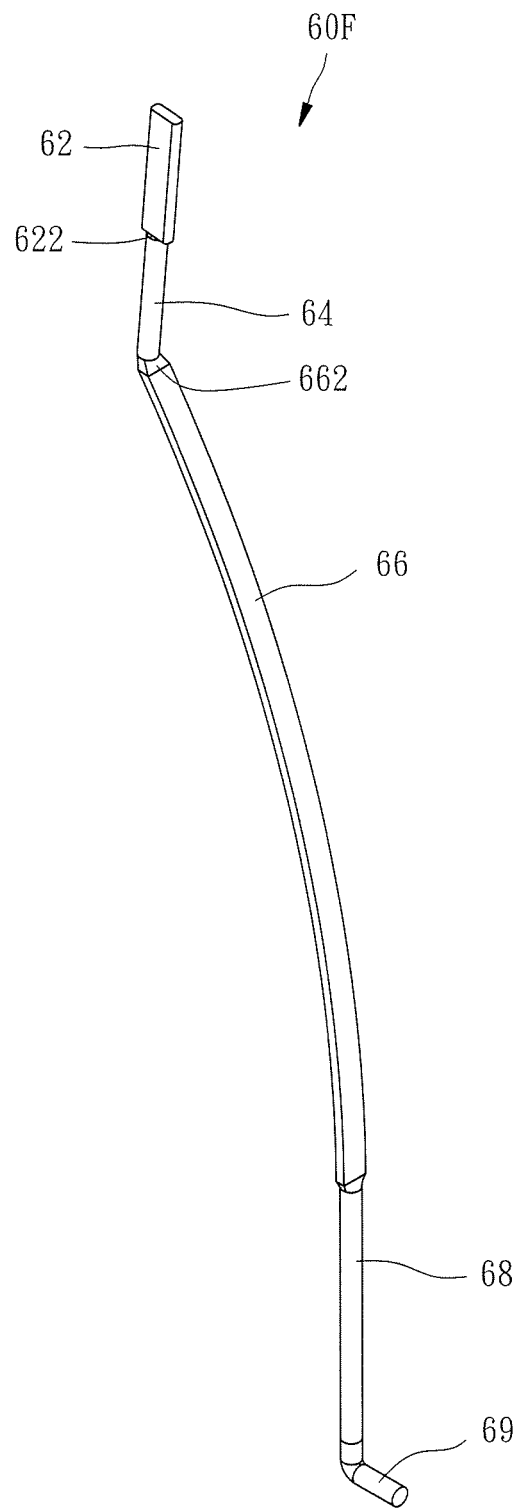
FIG. 14 is a schematic perspective view of a supporter according to a seventh preferred embodiment of the present invention.

The aforesaid vertical probe device 10 may use a supporter 60F configured according to a seventh preferred embodiment of the present invention, as shown in FIG. 14. The supporter 60F is similar to the supporter 60A shown in FIG. 6; however, the supporter 60A is made by semiconductor process, but the supporter 60F in this embodiment is made by mechanical shaping process. Specifically speaking, the supporter 60F is made of a straight cylinder, which is punched at an upper section thereof to form the flat head 62, and punched and bent (or not bent) at a middle section thereof to form the body 66. In this embodiment, the supporter 60F is further bent at a lower section thereof to form a pull-resisting portion 69; the body 66 and the pull-resisting portion 69 are connected to two ends of the tail 68 respectively.

Figure 15:
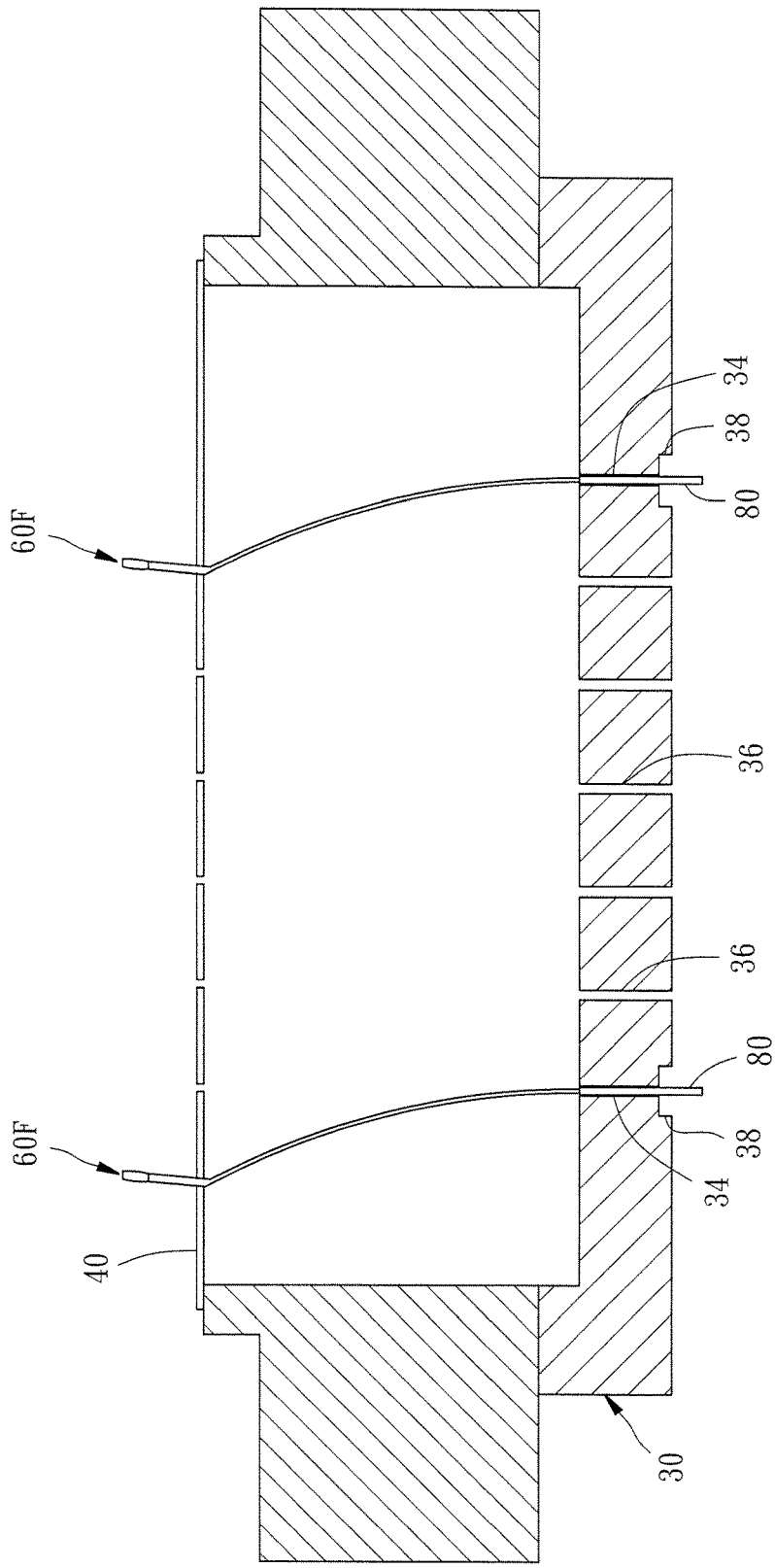
FIG. 15 is a schematic sectional view of a lower die, a positioning film and two supporters of the vertical probe device according to the seventh preferred embodiment of the present invention.
Figure 16:
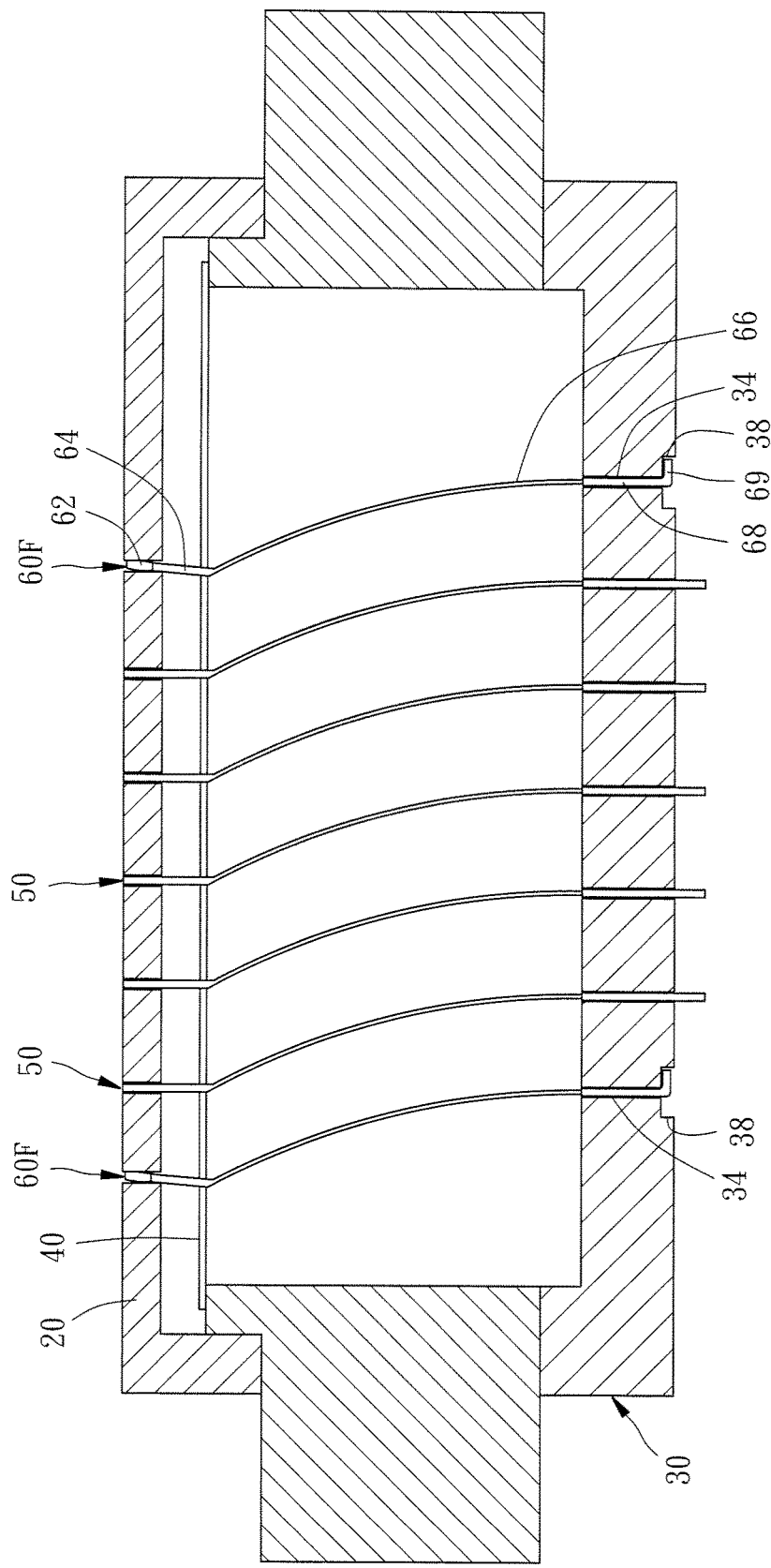
FIG. 16 is a schematic sectional view of the vertical probe device according to the seventh preferred embodiment of the present invention.

In this embodiment, the supporter 60F is not yet bent at the lower section thereof when being inserted through the positioning film 40 and being inserted into the lower die 30, as shown in FIG. 15; at this time, the lower section of the supporter 60F is a rod 80 having a continuous shape. Then, the rod 80 is bent to become the tail 68 and the pull-resisting portion 69, which are substantially perpendicular to each other, as shown in FIG. 16. After that, the probe needles 50 are penetrated through the positioning film 40 and the lower die 30, and then the upper die 20 is installed on the lower die 30 so as to complete the vertical probe device. As a result, the pull-resisting portion 69 of the supporter 60F is located out of the engaging hole 34 of the lower die 30 and stopped by the lower die 30 from entering the engaging hole 34. The lower die 30 may, but not limited to, be provided at the bottom thereof with a plurality of recesses 38 for receiving the pull-resisting portions 69 of the supporters 60F therein.

In this way, in the process that the vertical probe device is assembled or maintained, the pull-resisting portion 69 can prevent the tail 68 of the supporter 60F from being separated from the lower die 30 when the supporter 60F is pulled upwards by an external force, so that the positioning film 40 is prevented from being lifted up and flipped over.

In the aforesaid embodiments, each supporter has both the upper and lower stopping surfaces substantially facing to each other through the positioning film placed therebetween. However, because a plurality of supporters may be used in the vertical probe device, a single supporter may be configured having only the upper stopping surface that is provided at the head or the lower stopping surface that is provide at the body, as long as one or more of the supporters used in the vertical probe device have the upper stopping surface for limiting the positioning film under the upper stopping surface thereof and the other supporters have the lower stopping surface for limiting the positioning film on the lower stopping surface thereof. In other words, for a single supporter of the present invention, the supporter may have no such upper stopping surface; for example, the head 62 of the supporter 60A to 60E in the aforesaid first to fifth preferred embodiments may not be shaped as a narrow rectangle, but shaped as a profile having transverse cross-sections smaller than the transverse cross-sections of the neck 64, or shaped as a profile having transverse cross-sections same with the transverse cross-sections of the neck 64 and therefore connected with the neck 64 continuously. Alternately, a single supporter of the present invention may have no such lower stopping surface; for example, the body 66 of the supporter 60D in the aforesaid fourth preferred embodiment may have no such stopping section 666 and the extending section 668 thereof is designed to be connected with the neck 64 continuously. In other words, a single one of the supporters used in the vertical probe device provided by the present invention may be configured having at least one of the upper stopping surface 622 provided at the head 62 and a lower stopping surface 662 provided at the body 66; additionally, among the supporters used in the vertical probe device provided by the present invention, at least one of the supporters having the upper stopping surface 622 and at least one of the supporters having the lower stopping surface 662 will be sufficient to positively support the positioning film in position.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A vertical probe device comprising:
   a lower die having an outer bottom surface, an inner bottom surface formed by at least one recess recessed from the outer bottom surface, a plurality of engaging holes penetrating through the inner and outer bottom surfaces and a plurality of needle holes penetrating through the inner and outer bottom surfaces;
   a positioning film having a plurality of limiting holes and a plurality of needle holes;
   a plurality of probe needles configured for contacting a device under test and inserted through the needle holes of the lower die and the needle holes of the positioning film, respectively; and
   a plurality of supporters configured not to contact the device under test, each of the supporters having a head, a neck, a body and a tail, which are connected in order, and at least one of an upper stopping surface provided at the head and a lower stopping surface provided at the body; wherein at least one of the supporters has said upper stopping surface and at least one of the supporters has said lower stopping surface; the necks of the supporters pass through the limiting holes of the positioning film respectively, and the neck of each of the supporters is longer than a thickness of the positioning film, such that the positioning film is movable and limited between at least one said upper stopping surface and at least one said lower stopping surface of the supporters; the tails of the supporters are inserted into the engaging holes of the lower die without protruding out of the outer bottom surface of the lower die, respectively;
   wherein the supporters are arranged outside of the probe needles to support the positioning film in a way that the positioning film is spacedly located at a distance above the engaging holes and the needle holes of the lower die.

2. A vertical probe device comprising:
   a lower die having an outer bottom surface, an inner bottom surface formed by at least one recess recessed from the outer bottom surface, a plurality of engaging holes penetrating through the inner and outer bottom surfaces and a plurality of needle holes penetrating through the inner and outer bottom surfaces;
   a positioning film having a plurality of limiting holes and a plurality of needle holes;
   a plurality of probe needles configured for contacting a device under test and inserted through the needle holes of the lower die and the needle holes of the positioning film, respectively; and
   a plurality of supporters configured not to contact the device under test, each of the supporters having a head, a neck, a body and a tail, which are connected in order, and at least one of an upper stopping surface provided at the head and a lower stopping surface provided at the body; wherein at least one of the supporters has said upper stopping surface and at least one of the supporters has said lower stopping surface; the necks of the supporters pass through the limiting holes of the positioning film respectively, and the neck of each of the supporters is longer than a thickness of the positioning film, such that the positioning film is movable and limited between at least one said upper stopping surface and at least one said lower stopping surface of the supporters; the tails of the supporters are inserted into the engaging holes of the lower die without protruding out of the outer bottom surface of the lower die, respectively;
   wherein the supporters are arranged outside of the probe needles to support the positioning film in a way that the positioning film is spacedly located at a distance above the engaging holes and the needle holes of the lower die;
   wherein at least one of the supporters further has a pull-resisting portion configured in a way that the body and the pull-resisting portion are connected to two ends of the tail respectively; the pull-resisting portion of the at least one of the supporters is located out of the engaging hole of the lower die and stopped by the lower die.

3. The vertical probe device as claimed in claim 2, wherein the pull-resisting portion of the at least one of the supporters is located in the at least one recess; the tail and the pull-resisting portion of the at least one of the supporters are formed by bending a rod and substantially perpendicular to each other.

* * * * *